(12) United States Patent
Fautz et al.

(10) Patent No.: US 9,709,643 B2
(45) Date of Patent: Jul. 18, 2017

(54) METHOD AND APPARATUS FOR SAR REDUCTION USING B0 SPECIFIC RF EXCITATION

(71) Applicants: Hans-Peter Fautz, Forchheim (DE); Rene Gumbrecht, Herzogenaurach (DE)

(72) Inventors: Hans-Peter Fautz, Forchheim (DE); Rene Gumbrecht, Herzogenaurach (DE)

(73) Assignee: Siemens Aktiengesellschaft, München (DE)

( * ) Notice: Subject to any disclaimer, the term of this patent is extended or adjusted under 35 U.S.C. 154(b) by 760 days.

(21) Appl. No.: 14/076,017

(22) Filed: Nov. 8, 2013

(65) Prior Publication Data

US 2014/0132262 A1 May 15, 2014

(30) Foreign Application Priority Data

Nov. 9, 2012 (DE) .................. 10 2012 220 462

(51) Int. Cl.
*G01V 3/00* (2006.01)
*G01R 33/28* (2006.01)
*G01R 33/483* (2006.01)

(52) U.S. Cl.
CPC ....... *G01R 33/288* (2013.01); *G01R 33/4833* (2013.01)

(58) Field of Classification Search
CPC .... A61B 5/055; G01R 33/4828; G01R 33/50; G01R 33/5608; G01R 33/543
(Continued)

(56) References Cited

U.S. PATENT DOCUMENTS 7,459,908 B2 * 12/2008 Juchem .............. G01R 33/3873
324/319
2005/0033156 A1 2/2005 Kruger et al.
(Continued)

FOREIGN PATENT DOCUMENTS

DE 10330926 2/2005
DE 102010039555 2/2012
WO 2012138902 10/2012

OTHER PUBLICATIONS

German Office Action cited in German Application No. 10 2012 220 462.8, mailed Jul. 12, 2013, with English Translation.

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A method for generation of a radio-frequency (RF) pulse for excitation of nuclear spins in a predetermined layer of a specimen for magnetic resonance imaging and a magnetic resonance imaging device for performing the method are provided. The method includes determining a variation of a magnetic field in a measuring volume, and defining a spectral frequency distribution of the RF pulse. The RF pulse with the spectral frequency distribution is configured to excite nuclear spins in the specimen. The nuclear spins are polarized by the magnetic field at a predetermined flip angle in the measuring volume under a boundary condition of a substantially minimum energy content. The method also includes generating the RF pulse with the defined spectral frequency distribution.

16 Claims, 5 Drawing Sheets

(58) Field of Classification Search
USPC ......................................................... 324/309
See application file for complete search history.

(56) References Cited

U.S. PATENT DOCUMENTS

| 2006/0284615 | A1* | 12/2006 | Nazafat .............. G01R 33/5635 |
| | | | 324/307 |
| 2007/0188172 | A1* | 8/2007 | Garwood ............... G01N 24/10 |
| | | | 324/310 |
| 2010/0001727 | A1* | 1/2010 | Frydman ............ G01R 33/4822 |
| | | | 324/310 |
| 2010/0325185 | A1* | 12/2010 | Balchandani .......... G01R 33/44 |
| | | | 708/403 |
| 2012/0043965 | A1 | 2/2012 | Heismann et al. |

* cited by examiner

METHOD AND APPARATUS FOR SAR REDUCTION USING B0 SPECIFIC RF EXCITATION

This application claims the benefit of DE 10 2012 220 462.8, filed on Nov. 9, 2012, which is hereby incorporated by reference in its entirety.

BACKGROUND

The present embodiments relate to generation of a radio-frequency pulse for excitation of nuclear spins in a predetermined layer of a specimen for magnetic resonance imaging.

Magnetic resonance imaging is known from the prior art as an imaging method with which hydrogen density and bonding conditions in an object under examination are determined from an excitation of nuclear spins of protons in a nucleus of the hydrogen in an external magnetic field B using an external radio-frequency signal and a radio-frequency measuring signal emitted thereupon by the object under examination. The radio-frequency measuring signal is converted into a visual representation of the object under examination. During this, for example, hydrous tissue or other substances with a nuclear spin different from zero may be detected.

The quality of the radio-frequency measuring signal and the images generated therefrom increases with the strength of the applied static external magnetic field B since, with an increasing magnetic field B, the energy distance of the states of the proton in the magnetic field increases. This has the result that an occupation difference, and hence the signal strength, increases in the thermal equilibrium. Field magnets for magnetic resonance imaging have, for example, magnetic fields between 1.5 T and 3 T and up to 7 T.

The radio-frequency signal used for the excitation of the nuclear spins is irradiated at the Larmor frequency, the resonance frequency of the nuclear spins in the external magnetic field. The Larmor frequency is proportional to the magnetic field strength B, and the specific absorption rate (SAR) of the electromagnetic radiation in the body is proportional to the square of the frequency f. Overall, the following is obtained for the specific absorption rate $$SAR \propto B^2 \theta^2 \Delta f$$

where $\theta$ is the flip angle with which the nuclear spin is to be tilted in alignment, and $\Delta f$ is the bandwidth of the excitation pulse. The bandwidth is determined by the variation of the magnetic field B in a measuring volume for which imaging is to be performed. In addition, a safety margin is to be provided in the bandwidth in order to take account of deviations of the magnetic field from the desired field strength that may be caused, for example, by the body of the actual patient or the environment of the magnetic resonance imaging device. If the safety margin in the bandwidth is set too low, the result is that nuclear spins are not excited or are excited in offset regions. During the reconstruction of the image, this has the result that these regions are not depicted or are depicted on incorrect coordinates and hence generate artifacts in the image.

For magnetic resonance imaging devices with magnetic fields of 3 T, peak pulse powers of the excitation pulses of 35 kW are achieved. Only a small part of this power is used for the excitation of the nuclear spins, while the majority is converted into heat in the body of the person to be examined.

From a certain degree of heating, there is a risk to the health of the person to be examined. For example, the eyeball is particularly sensitive to heating and may become opacified. For this reason, there are limit values specific to each country for a maximum allowable SAR. In magnetic resonance imaging devices with 3 T or more, therefore, the power of the excitation pulses is to be reduced, or the time intervals between the pulses are to be increased in order to adhere to a permissible mean value for the SAR. The result is that the examination lasts longer, or the image quality is below the technical achievable level with respect to resolution or the signal-to-noise ratio.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a magnetic resonance imaging device and a method for operation that enable adherence to specific absorption rate (SAR) limit values with the lowest possible deterioration of the image or prolongation of the measuring times are provided.

In one embodiment, a method for the generation of a radio-frequency pulse for the excitation of nuclear spins in a predetermined layer of a specimen for a magnetic resonance imaging and a magnetic resonance imaging device for performing the method are provided.

The method according to one or more of the present embodiments relates to the generation of a radio-frequency pulse for the excitation of nuclear spins in a predetermined measuring volume for the magnetic resonance imaging. The magnetic resonance imaging is performed by a magnetic resonance imaging device including a supply unit and a magnet unit for the generation of a magnetic field B that has a variation BV in the measuring volume. The supply unit also includes a control unit and a radio-frequency pulse generating unit.

The method according to one or more of the present embodiments includes determining a spatial variation of a magnetic field strength of the magnetic field B in the measuring volume by the control unit.

The method also includes defining a spectral frequency distribution of the radio-frequency pulse under a boundary condition of a substantially minimum energy content of the radio-frequency pulse by the control unit. The radio-frequency pulse with the spectral frequency distribution is configured to excite nuclear spins in the specimen in the magnetic field B in the measuring volume at a predetermined flip angle $\theta$ with a predetermined variance of the flip angle $\Delta\theta$.

In addition, the method according to one or more of the present embodiments includes generating the radio-frequency pulse with the defined spectral frequency distribution by the radio-frequency pulse generating unit.

In an advantageous way, this enables the determination of the spatial variation of the magnetic field B in the measuring volume, the definition of a frequency for every location of the measuring volume for the excitation of the nuclear spins at a predetermined flip angle $\theta$ with a predetermined variance of the flip angle $\Delta\theta$ and hence a spectral frequency distribution of the radio-frequency pulse for the excitation. For example, the spectral frequency distribution is defined such that the spectral frequency distribution only encompasses the previously determined frequency range, and hence, the radio-frequency pulse has a substantially minimum energy content. This is advantageously possible since the definition of the frequency range is based on information determined on the magnetic field variation. It is therefore not necessary to provide a safety margin for the frequency distribution that estimates unknown variations of the magnetic field B. The specific absorption rate (SAR) is proportional to the bandwidth of the radio-frequency pulse. With a lower bandwidth of the spectral frequency distribution and a substantially minimum energy content of the radio-frequency pulse, therefore, the SAR is lower without reducing the quality of the magnetic resonance signal for the measuring volume.

With the same limit value for the SAR, with the method according to one or more of the present embodiments, either the power of the radio-frequency pulse may be raised, and the signal quality may hence be improved, or the detection of the magnetic resonance imaging using a higher pulse rate may be accelerated.

In one embodiment, a magnetic resonance imaging device is provided. The magnetic resonance imaging device includes a magnet unit for the generation of a magnetic field B that has a variation BV of the magnetic field B in a predetermined measuring volume. The magnetic resonance imaging device also includes a supply unit. The supply unit has a control unit and a radio-frequency pulse generating unit. The control unit is configured to determine a spatial variation of a magnetic field strength of the magnetic field B in the measuring volume. The control unit is also configured to determine a spectral frequency distribution for a radio-frequency pulse under the boundary condition of a substantially minimum energy content of the radio-frequency pulse so that the radio-frequency pulse is suitable for the excitation of nuclear spins in the specimen in the magnetic field B in the measuring volume at a predetermined flip angle θ with a predetermined variance of the flip angle Δθ. In addition, the radio-frequency pulse generating unit is configured to generate the radio-frequency pulse with the spectral distribution.

Advantageously, the magnetic resonance imaging device according to one or more of the present embodiments is configured to perform the method for the generation of a radio-frequency pulse and, therefore, has the advantages of the method already explained above.

In one embodiment, before the act of determining a spatial variation BV of a magnetic field strength of the magnetic field B, the method includes the acts of determining a spatial variation of a magnetic field strength of a magnetic field B' in the measuring volume and correcting the magnetic field B' to a magnetic field B so that the magnetic field B in the measuring volume has a smaller spatial variation of the magnetic field strength than the magnetic field B'. A correction may, for example, take place by shimming using magnetic materials in the magnetic field B' or by additional magnetic fields generated by coils.

The correction of the magnetic field reduces the variance of the resultant magnetic field B and hence the required spectral frequency distribution in the bandwidth, which advantageously results in a lower SAR.

In one embodiment, the act of the determination of the variation of the magnetic field B includes a measurement of an uncorrected magnetic field B' and the calculation of a magnetic field B resulting from the uncorrected magnetic field B' and a correction field B".

The measurement of the uncorrected magnetic field B' enables the deviation from a homogeneous ideal field to be determined. From this, how a correction field may be adjusted and which resulting magnetic field B is derived from the superimposition of the uncorrected magnetic field B' and the correction field B" may be determined. This information may be used to determine the spectral frequency distribution of the radio-frequency pulse and advantageously provides that there is no need for a safety margin, which results in a larger bandwidth and increases the SAR value.

In one embodiment of the method, the act of determining the variation of the magnetic field B includes a measurement of the corrected magnetic field B.

This advantageously also enables influences that may not be precisely predicted in a calculation to be taken into account in the determination of the variation. Hence, the spectral frequency distribution of the radio-frequency pulse may be adapted even more precisely, which results in a lower SAR value or a shorter measuring time.

In one embodiment, the variation of the magnetic field B is determined using an analysis of a spectral distribution of a resonance line of a non-spatially resolved reference measurement in the measuring volume.

A non-spatially resolved reference measurement advantageously enables the entire measuring volume to be determined with one measurement within a short time. The variation of the magnetic field B is reflected in the distribution of the resonance line and enables a spectral distribution of the radio-frequency pulse that permits excitation of the nuclear spins in the entire measuring volume to be determined therefrom. In one embodiment, the measurement may be performed in the presence of the patient so that all the influences of the patient on the magnetic field B may be taken into account.

In one embodiment, the definition of the spectral frequency distribution of the radio-frequency pulse is performed using a definition of a duration of the radio-frequency pulse. This type of adjustment of the spectral frequency distribution of the radio-frequency pulse is simple to achieve from the point of view of circuit engineering.

In another embodiment, the excitation of the nuclear spins is performed by the radio-frequency pulse in the magnetic field B. The magnetic field B has a gradient field BG as a component. The definition of the spectral frequency distribution of the radio-frequency pulse is performed by a definition of a temporal course of an amplitude of the radio-frequency pulse as a function of a temporal course of an amplitude of the gradient field BG.

The inclusion of the gradient field achieves an additional degree of freedom, which, for example, enables the gradient field and together therewith the amplitude of the radio-frequency pulse to be reduced in a time interval with a maximum amplitude of the radio-frequency pulse. Since precisely at the maximum amplitude a particularly large amount of energy is transferred into the specimen, the SAR value may be reduced to a particularly high degree.

In another embodiment, the radio-frequency pulse includes a plurality of partial pulses, and the definition of the spectral frequency distribution of the radio-frequency pulse is performed by a definition of the number of partial pulses. An adjustment of the radio-frequency pulse by the number of partial pulses is simple to achieve from the point of view of circuit engineering. The magnetic resonance imaging device for the performance of the method also shares the advantages of the method, and therefore, these will not be repeated for the individual apparatus embodiments.

DETAILED DESCRIPTION

Figure 1:
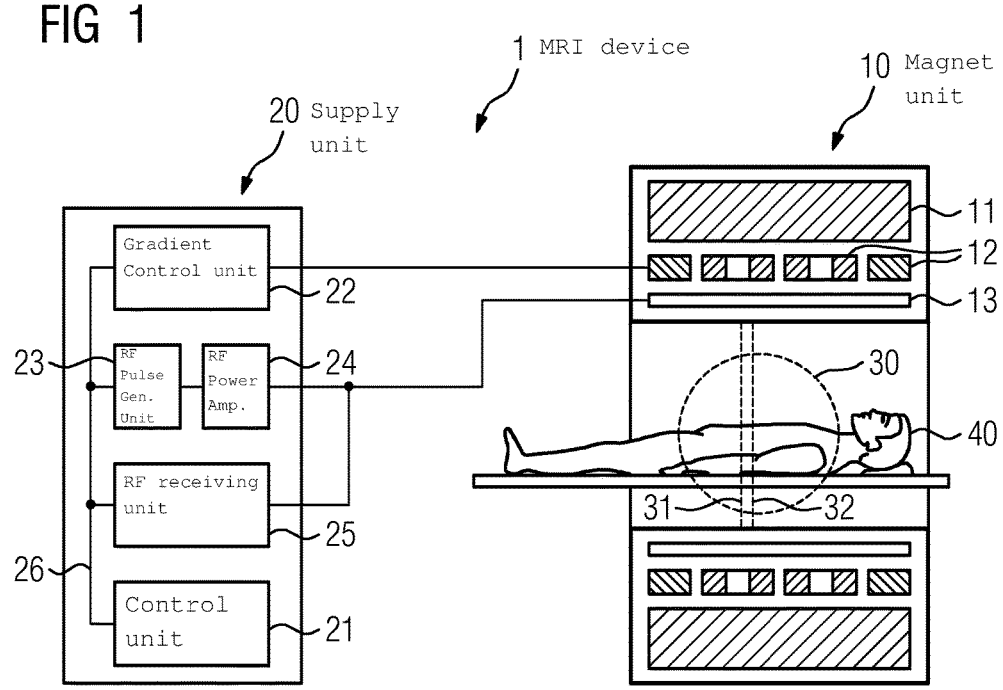
FIG. 1 is a schematic representation of one embodiment of a magnetic resonance imaging device.

FIG. 1 is a schematic representation of one embodiment of a magnetic resonance imaging device 1. The magnetic resonance imaging device 1 includes two units 10, 20 (e.g., a magnet unit and a supply unit).

The magnet unit 10 includes a field magnet 11 that generates a static magnetic field B for alignment of nuclear spins in specimens or patients 40 in a measuring volume 30. In one embodiment, the field magnet 11 is a supraconductive magnet that may provide magnetic fields with a magnetic flux density of up to 3 T or above this. However, for lower field strengths, permanent magnets or electromagnets with normally conductive coils may also be used.

The magnet unit 10 also includes gradient coils 12 that are configured, for spatial differentiation of image regions detected in the measuring volume 30, to superimpose variable magnetic fields BG or gradient fields BG on the magnetic field B in three directions in space. The gradient coils may be coils made of normally conductive wires that are able to generate magnetic fields BG that are orthogonal to one another in the measuring volume 30.

The magnet unit 10 also includes a body coil 13 that is configured to radiate a radio-frequency signal supplied via a signal line into the measuring volume 30 and to receive resonance signals emitted by the specimen (e.g., by the patient 40) and emit the resonance signals via the signal line. In one embodiment, the body coil 13 may be replaced by local coils that are arranged in the measuring volume 30 close to the patient 40 for the transmission of the radio-frequency signal and/or reception.

The supply unit 20 supplies the magnet unit 10 with the different signals for the gradient coils 12 and the body coil 13 or the local coils and evaluates the received signals.

For example, the supply unit 20 includes a gradient control unit 22 that is configured to supply the gradient coils 12 with variable currents via leads that provide the desired gradient fields BG in chronological coordination in the measuring volume 30.

The supply unit 20 also includes a radio-frequency pulse generating unit 23 configured to generate a radio-frequency pulse with a prespecified temporal course, amplitude and spectral power distribution. The pulse is amplified by a radio-frequency power amplifier 24 to a power used for the excitation or to tilt nuclear spins in the specimen 40 in the magnetic field B or in a resultant magnetic field from a superimposition of the magnetic field B and gradient fields BG. In one embodiment, power may be generated in the kilowatt range.

The supply unit 20 also includes a radio-frequency receiving unit 25 configured to evaluate radio-frequency signals received by the body coil 13 or a local coil and supplied via a signal line of the radio-frequency-receiving unit 25 with respect to amplitude and phase. This, for example, relates to radio-frequency signals that emit nuclear spins in the specimen 40 as a response to the excitation by a radio-frequency pulse in the magnetic field B or in a resultant magnetic field from a superimposition of the magnetic field B and gradient fields BG.

The supply unit 20 also includes a control unit 21 configured to provide the chronological coordination of the activities of the gradient control unit 22, the radio-frequency pulse generating unit 23 and the radio-frequency-receiving unit 25. The control unit 21 is connected to and in signal exchange with the other units 22, 23, 25 via a signal bus 26. The control unit 21 is configured to receive and process signals from the specimen 40 evaluated by the radio-frequency-receiving unit 25 and to specify and chronologically coordinate pulse and signal shapes for the gradient control unit 22 and the radio-frequency pulse generating unit 23. The control unit 21 is, for example, configured to perform the method depicted in FIG. 2 and FIG. 3 in conjunction with the units 22, 23, 24, 25 and the magnet unit 10.

Figure 2:
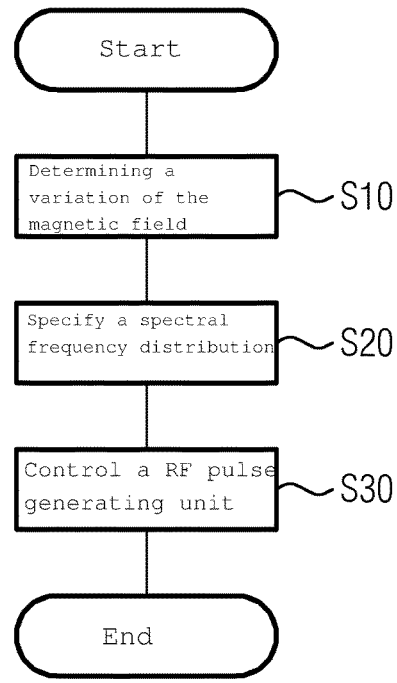
FIG. 2 is a flow diagram of one embodiment of a method for generation of a radio-frequency pulse.

FIG. 2 is a flow diagram showing one embodiment of a method for the generation of a radio-frequency pulse.

In act S10, the control unit 21 determines a variation BV of the magnetic field B in the measuring volume 30, in which the specimen 40 is arranged. In one embodiment of the method, the control unit 21 determines the deviation of the uncorrected magnetic field B' by a measurement. This may, for example, be a non-spatially resolved magnetic resonance measurement on a test specimen in the measuring volume 30. From the measured magnetic field distribution of B', the control unit calculates a correction of the field by a correction field B". This correction field may, for example, be generated by correction field coils (e.g., shim-coils) that are controlled by the control unit 21 according to the calculated correction with current for the generation of the correction field B". In one embodiment, the magnetic field may be provided by an operator according to the calculated correction measures by elements made of magnetic material arranged on the field magnet 11. Under the impact of the correction field B", the resulting magnetic field B at least approximately corresponds to the magnetic field calculated by the control unit 21. The variation BV of the magnetic field B is determined by the control unit from the difference of the magnetic field B for the locations in the measuring volume 30 from a mean value of the magnetic field or from a constant desired value.

In act S20, the control unit 21 specifies a spectral frequency distribution of the radio-frequency pulse. The control unit 21 already knows a variation BV of the magnetic field B in the measuring volume 30 from the act S10. The excitation frequency (e.g., the Larmor frequency) for a nuclear spin in a magnetic field B is proportional to the magnetic field B by a proportionality factor dfB. During magnetic resonance imaging, the specimen 40 may be scanned in layers that may be bounded by a first plane 31 and a second plane 32 that are parallel to one another. A layer of this kind also corresponds to the representation of the specimen 40 in a sectional view. The thickness of the layer is determined by a gradient field BG that is superimposed on the magnetic field B, and the spectral frequency distribution of the radio-frequency pulse. For a layer with the thickness Dz perpendicular to the z-axes, the gradient field BG is also oriented in the z-direction and has a constant change in the field strength $dBz=dB/dz$ in the z-direction. In an ideal magnetic field B without spatial variation, the bandwidth of the radio-frequency pulse for the excitation for all the nuclear spins in the layer would be $df=dfB*dBz*Dz$. In a non-ideal magnetic field B with a spatial variation BV of the magnetic field B, the control unit 21 determines the excitation frequency of the radio-frequency pulse for every point of the layer. From this, the control unit 21 determines the frequency interval that the radio-frequency pulse is to cover from the highest and the lowest determined excitation frequency. In one embodiment, assuming continuity, the control unit 21 may only consider the excitation frequencies for the points in the planes 31, 32 bounding the layer.

In one embodiment, the excitation of the nuclear spins in the measuring volume may be performed at a predetermined flip angle θ with a predetermined variance of the flip angle Δθ without the application of a gradient field BG, and the spatial resolution may be performed by phase encoding of the spin echoes in 2 coordinates. In this embodiment, in act S20, the control unit 21 determines the spectral frequency distribution of the radio-frequency pulse solely based on the value of the magnetic field B and the determined variation.

The determination of the spectral frequency distribution is performed in act S20 under the boundary condition of a substantially minimum energy content of the radio-frequency pulse. A radio-frequency pulse with minimum energy content may be configured such that the radio-frequency pulse would precisely effect the excitation of all nuclear spins in the measuring volume at a predetermined flip angle θ. In one embodiment of the method and one embodiment of the magnetic resonance imaging device 1, due to measuring inaccuracies and tolerances, a slightly greater energy content may be provided in order to reliably avoid artifacts in the image due to insufficiently excited nuclear spins. For example, in one embodiment, the substantially minimum energy content may be double the value of the minimum energy content. In a method and magnetic resonance imaging device according to one or more of the present embodiment, with lower tolerances, the substantially minimum energy content may be 1.5 times or 1.2 times the minimum energy content.

In act S30, the control unit 21 controls the radio-frequency pulse generating unit 23 in order to generate a radio-frequency pulse of the spectral frequency distribution determined. Various possibilities for influencing the spectral frequency distribution are explained for FIGS. 4 to 7. The radio-frequency pulse is amplified by the radio-frequency power amplifier 24 and emitted by the body coil 13 or a local coil in the measuring volume 30.

In the prior art, the variation of the magnetic field B is estimated and, on the basis of this estimation, the spectral frequency distribution is set larger with certain safety factors. Therefore, in the prior art, the specific absorption rate SAR is also higher than is necessary for the excitation of the desired layer.

Figure 3:
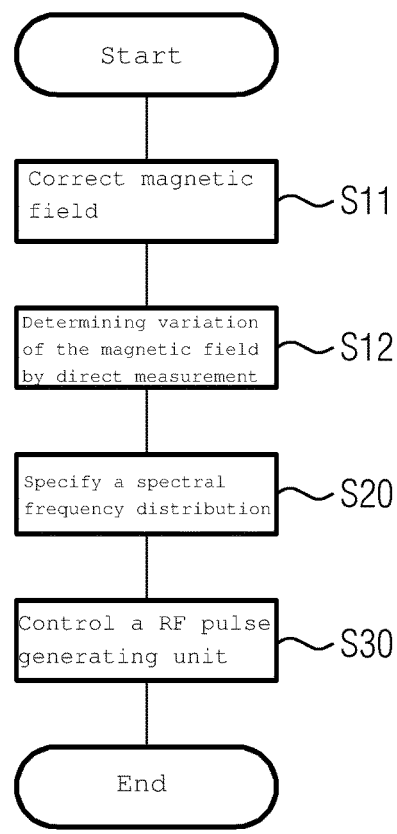
FIG. 3 is a flow diagram of one embodiment of a method for the generation of a radio-frequency pulse.

FIG. 3 shows a flow diagram of a further method according to one or more of the present embodiments for the generation of a radio-frequency pulse.

In contrast to the method shown in FIG. 2, act S10 of the determination of the variation of the magnetic field B is divided into two sub-acts S11 and S12.

As already described for FIG. 2, in act S11, the uncorrected magnetic field B' is initially corrected by a correction field B" using shim coils or shim irons.

In act S12, the variation BV of the magnetic field B is determined directly by a measurement. A specimen 40 is, for example, arranged in the measuring volume 30. This may, for example, be either a dummy (e.g., a hollow body filled with water) or a patient 40. A radio-frequency pulse is irradiated via the body coil 13 into the specimen 40 without a gradient field BG being applied. A narrow-band (e.g., almost linear) excitation signal may be sufficient for the excitation. Since in reality it may be assumed that there is a variation of the magnetic field B, the excitation is performed with a radio-frequency pulse with an estimated broad spectral distribution so that nuclear spins are excited in the specimen at all locations in the measuring volume 30. In response to the excitation, the specimen 40 emits a magnetic resonance signal that is received by the body coil 13 or a local coil, processed in the radio-frequency-receiving unit 25 and evaluated by the control unit 21 for the spectral line width of the magnetic resonance signal. The spectral line width of the received signal is, for example, a direct measurement for the variation BV of the magnetic field B. The control unit determines a spectral frequency distribution according to act S20 and generates a corresponding radio-frequency pulse according to act S30, as already explained with respect to FIG. 2.

Figure 4:
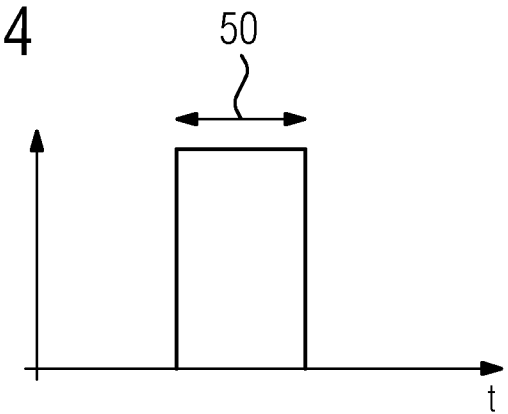
FIG. 4 shows an exemplary radio-frequency pulse.
Figure 5:
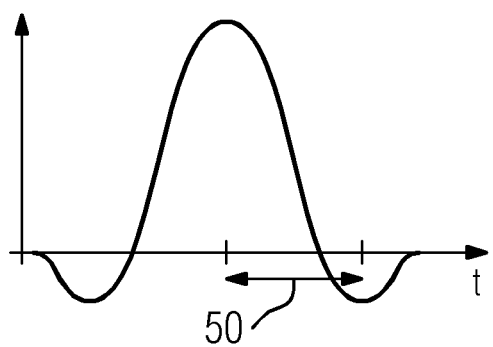
FIG. 5 shows another exemplary radio-frequency pulse.

FIGS. 4 and 5 represent two possibilities for altering the spectral frequency distribution of the pulse via the pulse width. The figures show in each case the amplitude plotted on the y-axis and the time plotted on the x-axis. The amplitude may, for example, be determined by the voltage at the output of the radio-frequency pulse generation unit 23 or also by a magnetic field strength of an electromagnetic AC field generated by the body coil 13.

FIG. 4 shows the simplest possible pulse shape. This is a rectangular pulse that, for a pre-specified pulse duration, specifies a constant amplitude different from zero and otherwise an amplitude equal to zero. It is known from the spectral analysis (e.g., using a Fourier transformation) that the fundamental frequency is $f0=1/(2*t0)$ for a pulse duration t0 50. The rectangular pulse has spectral components with uneven multiples n of the fundamental frequency, the amplitudes of which decrease slowly with n. In one embodiment, using the superimposition of a plurality of rectangular pulses, a spectral frequency distribution may be approximated.

FIG. 5 shows an exemplary chronologically symmetrical pulse shape with no abrupt jumps in amplitude. Therefore, the pulse shape has a significantly narrower spectral distribution bandwidth. For t0 50, the fundamental frequency is approximately represented by $f0=1/(2*t0)$.

Figure 6:
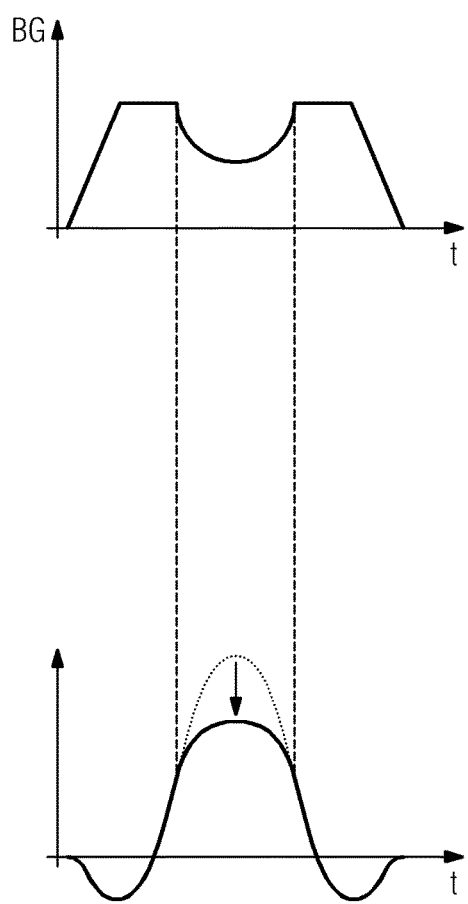
FIG. 6 shows an exemplary radio-frequency pulse in a time relationship with a gradient field.

FIG. 6 shows a variation of the radio-frequency pulse of FIG. 5, and the magnetic gradient field strength BG is plotted in the upper diagram in FIG. 6.

The power of a radio-frequency pulse is proportional to the square of the amplitude of the voltage or the field strength (e.g., electric or magnetic). The spectral distribution of the energy of a pulse may therefore be greatly influenced in the frequency range if the maximum amplitude there has a low spectral bandwidth. In FIG. 6, the maximum amplitude is correspondingly lowered and rounded, thereby corresponding to a lower proportion of high frequencies. In order simultaneously to excite a sufficiently high thickness of the layer, the gradient field is lowered synchronously to the amplitude lowering of the radio-frequency pulse that, due to the lower gradient, increases the layer thickness again and hence compensates for the amplitude lowering and the associated reduced spectral frequency distribution of the pulse.

Figure 7:
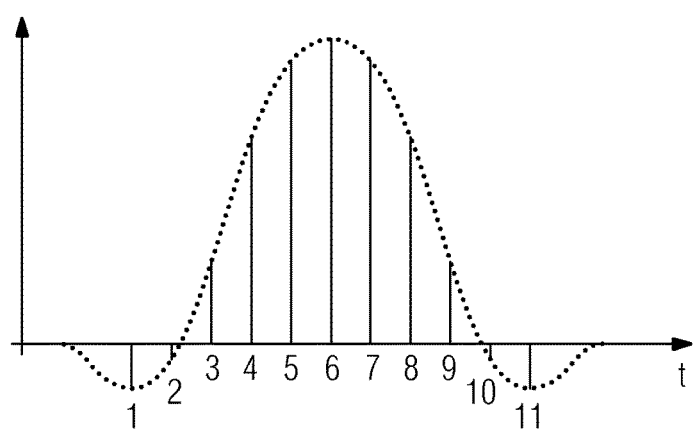
FIG. 7 shows an exemplary radio-frequency pulse.

FIG. 7 shows a further possibility for influencing the spectral distribution of the radio-frequency pulse. A steep pulse shape, as shown, for example, in FIG. 5, may also be approximated by a plurality of discrete, short rectangular pulses. With an increasing number of pulses, the spectral frequency distribution of the resultant radio-frequency pulse also approximates the narrow-band distribution of the pulse from FIG. 5, which may, for example, be demonstrated by a Fourier analysis. In this way, the bandwidth may be varied between that of a rectangular pulse according to FIG. 4 and that of a narrow-band pulse according to FIG. 5 with the number of partial pulses.

Although the invention was illustrated and described in more detail by the exemplary embodiments, the invention is not restricted by the disclosed examples. Other variations may be derived herefrom by the person skilled in the art without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for generation of a radio-frequency (RF) pulse using a magnetic resonance imaging device for excitation of nuclear spins in a predetermined measuring volume for magnetic resonance imaging, wherein the magnetic resonance imaging device comprises a supply unit and a magnet unit, and wherein the supply unit comprises a controller and an RF pulse generating unit, the method comprising:
    determining, with the controller, a spatial variation of a magnetic field strength of a magnetic field in the predetermined measuring volume;
    defining, with the controller, a spectral frequency distribution of the RF pulse under a boundary condition of a substantially minimum energy content of the RF pulse, wherein the spectral frequency distribution only encompasses a previously determined frequency range of the spatial variation of the magnetic field strength of the magnetic field in the predetermined measuring volume, and wherein the RF pulse with the spectral frequency distribution is configured to excite nuclear spins in a specimen in the magnetic field in the predetermined measuring volume at a predetermined flip angle with a predetermined variance of the flip angle;
    generating, with the RF pulse generating unit, the RF pulse with the defined spectral frequency distribution; and
    imaging, with the magnetic resonance imaging device, the specimen using the generated RF pulse.

2. The method of claim 1, wherein the substantially minimum energy content is at the most twice a minimum possible energy content.

3. The method of claim 1, wherein determining the spatial variation of the magnetic field comprises measuring the magnetic field.

4. The method of claim 3, wherein determining the spatial variation of the magnetic field further comprises using an analysis of a spectral distribution of a resonance line of a non-spatially resolved reference measurement in the specimen.

5. The method of claim 1, wherein defining the spectral frequency distribution of the RF pulse comprises using a definition of a duration of the RF pulse.

6. The method of claim 1, wherein the excitation of the nuclear spins is performed by the RF pulse in the magnetic field, and the magnetic field has a gradient field as a component,
    wherein defining the spectral frequency distribution of the RF pulse comprises defining a temporal course of an amplitude of the RF pulse as a function of a temporal course of an amplitude of the gradient field.

7. The method of claim 1, wherein the RF pulse comprises a plurality of partial pulses, and
    wherein defining the spectral frequency distribution of the RF pulse comprises defining a number of the plurality of partial pulses.

8. A magnetic resonance imaging device comprising:
    a magnet unit operable to generate a magnetic field that has a variation of the magnetic field in a predetermined measuring volume; and
    a supply unit comprising a control unit and a radio-frequency (RF) pulse generating unit,
    wherein the control unit is configured to:
        determine a spatial variation of a magnetic field strength of the magnetic field in the predetermined measuring volume;
        determine a spectral frequency distribution for an RF pulse under a boundary condition of a substantially minimum energy content of the RF pulse, wherein the spectral frequency distribution only encompasses a previously determined frequency range of the spatial variation of the magnetic field strength of the magnetic field in the predetermined measuring volume, and wherein the RF pulse is suitable to excite nuclear spins in a specimen in the magnetic field in the predetermined measuring volume at a predetermined flip angle with a predetermined variance of the flip angle,
    wherein the RF pulse generating unit is configured to generate the RF pulse with the spectral frequency distribution, and
    wherein the magnetic resonance imaging device is configured to image the specimen using the generated RF pulse.

9. The magnetic resonance imaging device of claim 8, wherein the substantially minimum energy content is at the most twice a minimum possible energy content.

10. The magnetic resonance imaging device of claim 8, wherein the control unit is further configured to determine the spatial variation of the magnetic field in the predetermined measuring volume using an analysis of a spectral distribution of a resonance line of a non-spatially resolved reference measurement in the predetermined measuring volume.

11. The magnetic resonance imaging device of claim 8, wherein the control unit is further configured to adjust the spectral frequency distribution of the RF pulse by a duration of the RF pulse.

12. The magnetic resonance imaging device of claim 8, wherein the excitation of the nuclear spins is performed by the RF pulse in the magnetic field, and the magnetic field has a gradient field as a component, wherein the magnetic resonance imaging device is configured to excite the nuclear spins by the RF pulse in the magnetic field, and the magnetic field has a gradient field as a component, wherein the control unit is configured to adjust the spectral frequency distribution of the RF pulse by specifying a temporal course of an amplitude of the RF pulse as a function of a temporal course of an amplitude of the gradient field.

13. The magnetic resonance imaging device of claim 8, wherein the RF pulse includes a plurality of partial pulses, and the control unit is configured to adjust the spectral frequency distribution of the RF pulse by a number of the plurality of partial pulses.

14. The magnetic resonance imaging device of claim 8, wherein the control unit is further configured to determine the variation of the magnetic field in the predetermined measuring volume using an analysis of a spectral distribution of a resonance line of a non-spatially resolved reference measurement in the predetermined measuring volume.

15. The magnetic resonance imaging device of claim 8, wherein the control unit is further configured to adjust the spectral frequency distribution of the RF pulse by a duration of the RF pulse.

16. The magnetic resonance imaging device of claim 8, wherein the excitation of the nuclear spins is performed by the RF pulse in the magnetic field, and the magnetic field has a gradient field as a component, wherein the magnetic resonance imaging device is configured to excite the nuclear spins by the RF pulse in the magnetic field, and the magnetic field has a gradient field as a component, wherein the control unit is configured to adjust the spectral frequency distribution of the RF pulse by specifying a temporal course of an amplitude of the RF pulse as a function of a temporal course of an amplitude of the gradient field.

* * * * *